(12) United States Patent
Nakamura et al.

(10) Patent No.: US 6,548,903 B2
(45) Date of Patent: Apr. 15, 2003

(54) SEMICONDUCTOR INTEGRATED CIRCUIT

(75) Inventors: Toshikazu Nakamura, Kawasaki (JP); Toshiya Miyo, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 10/066,630

(22) Filed: Feb. 6, 2002

(65) Prior Publication Data
US 2003/0025122 A1 Feb. 6, 2003

(30) Foreign Application Priority Data
Jul. 31, 2001 (JP) ........................................ 2001-230906

(51) Int. Cl.[7] ........................ H01L 23/48; H01L 23/52; H01L 29/40
(52) U.S. Cl. ...................... 257/758; 257/296; 257/306; 365/16
(58) Field of Search ................................ 257/758, 296, 257/306; 365/16

(56) References Cited

U.S. PATENT DOCUMENTS

| | | | | |
|---|---|---|---|---|
| 4,669,063 A | * | 5/1987 | Kirsch | .......................... 365/189 |
| 4,980,863 A | * | 12/1990 | Ogihara | ....................... 365/205 |
| 5,500,815 A | * | 3/1996 | Takase et al. | ................ 365/149 |
| 5,525,820 A | * | 6/1996 | Furuyama | |
| 6,144,055 A | * | 11/2000 | Takenaka | ..................... 257/301 |
| 6,384,439 B1 | * | 5/2002 | Walker | ........................ 257/296 |

FOREIGN PATENT DOCUMENTS

JP    2001-23374    1/2001

* cited by examiner

*Primary Examiner*—David Nelms
*Assistant Examiner*—Andy Huynh
(74) *Attorney, Agent, or Firm*—Arent Fox Kintner Plotkin & Kahn, PLLC

(57) ABSTRACT

In the first and second regions data not concurrently transferred is transferred by using data lines having the respective different wiring layers. The vertical positions of the data lines are reversed between the first and second regions. In the switching regions the data lines are exchanged between the first and second regions. The parasitic capacitances associated with the two data lines are practically equal to each other so that the delay times of signals transferred along the data lines are equal to each other. This can prevent a circuit malfunction due to a parasitic capacitance difference. In the semiconductor integrated circuit where memory cell arrays and sense amplifier arrays are alternately wired, forming the first and second regions over the memory cell arrays and the switching regions over the sense amplifier arrays makes it easier to exchange the vertical positions of the data lines in the switching regions.

6 Claims, 8 Drawing Sheets

SEMICONDUCTOR INTEGRATED CIRCUIT

BACKGROUND OF THE INVENTION

1. Field of the Invention

The invention relates to a wiring structure of data lines in a semiconductor integrated circuit.

2. Description of the Related Art

Conventionally, a semiconductor integrated circuit, such as a DRAM, includes shield wires each interposed between data lines so as to avoid coupling noise from their adjacent wires. However, when the number of data bits is large, the required number of data lines becomes large, and hence the number of the shield wires accordingly increases. As a result, the wiring region of the data lines is disadvantageously enlarged. Japanese Unexamined Patent Application Publication No. 2001-23374 discloses a technique that in a DRAM, the write and read data lines which are not simultaneously used for transferring data are alternately wired and that the write data lines are utilized as shield wires during the read operation, while the read data lines are utilized as shield wires during the write operation. This wiring structure requiring substantially no shield wires prevents an increase in the wiring area.

FIG. 1 shows a wiring structure of data lines for transferring data between memory cell arrays and a data input/output circuit in a semiconductor integrated circuit as described above. Between the memory cell arrays and the data input/output circuit, there are alternately wired write data lines WDL and /WDL for transferring complementary write data during the write operation and read data lines RDL and /RDL for transferring complementary read data during the read operation. These write and read data lines WDL, /WDL, RDL and /RDL are wired by use of the same wire pitch as, for example, complementary bit lines BL and /BL (bit line pairs) (not shown). That is, the write data lines WDL and /WDL and the read data lines RDL and /RDL are wired corresponding to the respective bit line pairs in the memory cell arrays and are shared between these bit line pairs.

As shown in FIG. 1, there exist parasitic capacitances C0 between the adjacent data lines. There also exist parasitic capacitances C1 and C2 between the data lines and the semiconductor substrate and between the data lines and a metal wire UL of the overlying layer, respectively. Since every data line has a total parasitic capacitance of "2C0+C1+C2", the data transfer times (delay times) necessary for transferring the data along the respective data lines are equal.

In a semiconductor integrated circuit such as a system LSI including a DRAM core, data read from the DRAM core may be directly outputted to a controller in the integrated circuit, and data to be written into the DRAM core may be directly inputted from the controller. In the above semiconductor integrated circuit, simultaneously outputting to the controller many pieces of data read from the memory cells onto the bit lines and then amplified by the sense amplifiers can improve the data transfer rate. In this case, since the data lines cannot be shared between bit line pairs, the data lines must be formed corresponding to each bit line pair. For this reason, unlike FIG. 1, a plurality of wiring layers must be used to form the data lines.

FIG. 2 shows an example wherein two wiring layers L1 and L2 are used to wire the data lines. In this example, the write and read data lines WDL and /RDL are alternately wired in the wiring layer L1 overlying the semiconductor substrate, and the read and write data lines RDL and /WDL are alternately wired in the wiring layer L2 overlying the wiring layer L1. Using these two wiring layers L1 and L2 allows the write data lines WDL and /WDL and the read data lines RDL and /RDL to be wired corresponding to each bit line pair. For this reason, many pieces of data amplified by the sense amplifiers can be simultaneously outputted to the controller or the like via the write and read data lines WDL, /WDL, RDL and /RDL. This can improve the data transfer rate.

In the wiring structure of FIG. 2, however, parasitic capacitances C0 and C3 exist between the adjacent data lines in the wiring layer L1 and between the adjacent data lines in the wiring layer L2, respectively. Parasitic capacitances C1 and C2 also exist between the data lines of the wiring layer L1 and the substrate and between the data lines of the wiring layer L1 and the data lines of the wiring layer L2, respectively. Parasitic capacitances C4 also exist between the data lines of the wiring layer L2 and the metal wire UL of the overlying layer. As a result, in FIG. 2, every data line of the wiring layer L1 has a total parasitic capacitance of "2C0+C1+C2", while every data line of the wiring layer L2 has a total parasitic capacitance of "2C3+C2+C4".

In the wiring structure of FIG. 2, since the parasitic capacitances associated with the data lines are different between the wiring layers L1 and L2, the data transfer times (delay times) necessary for transferring the data along the data lines of the wiring layers L1 and L2 are also different. In many cases, the insulator film formed on the semiconductor substrate is different in material and thickness from the insulator film formed under the metal wire UL. For this reason, the difference especially between the capacitances C1 and C4 is large. The parasitic capacitance difference results not only from the materials of the insulator films but also from the tolerance of the fabrication process.

Thus, there is a possibility that complementary write data transferred along the data lines WDL and /WDL cannot be transferred to the memory cell array at the same timing, resulting in an erroneous data write into the memory cells. Similarly, there is also a possibility that complementary read data transferred along the data lines RDL and /RDL cannot be transferred to the controller or the like at the same timing, resulting in incorrectly reading the data read from the memory cells.

SUMMARY OF THE INVENTION

It is an object of the present invention to prevent the circuit malfunction which would otherwise occur due to a parasitic capacitance difference, by equalizing the parasitic capacitances associated with the data lines in a semiconductor integrated circuit that uses a plurality of wiring layers to transfer data. In particular, it is an object of the present invention to prevent the circuit malfunction by equalizing the data transfer times when complementary data lines are used to transfer data.

According to one of the aspects of the semiconductor integrated circuit of the present invention, in the first region, a first data line is wired by use of a first wiring layer formed over a semiconductor substrate, and a second data line extending over the first data line is wired by use of a second wiring layer formed over the first wiring layer. In the second region, the second data line is wired by use of the first wiring layer, and the first data line extending over the second data line is wired by use of the second wiring layer. Here, data is transferred to the first and second data lines at respective different timings.

A switching region is formed between the first and second regions. In the switching region, the first data line wired in the first region is connected to the first data line wired in the second region, and the second data line wired in the first region is connected to the second data line wired in the second region. In the switching region, at least either of the first data lines and the second data lines are connected to each other via a third wiring layer formed over the semiconductor substrate.

In general, the parasitic capacitances formed between the data lines formed in the first wiring layer and the semiconductor substrate are different from the parasitic capacitances formed between the data lines formed in the second-wiring layer and its overlying wire. According to the present invention, vertically reversing positioning of the first and second data lines between the first and second regions substantially equalizes the total parasitic capacitances associated with the first data lines and the second data lines. This results in equalizing the delay times of the signals transferred along the first and second data lines, thereby preventing the circuit malfunction which otherwise would occur due to a parasitic capacitance difference.

Moreover, this vertically reversed positioning of the first data lines and second data lines between the first and second regions makes it possible to shorten the distances at which the first and second data lines extend in parallel to the overlying or underlying wires. This can prevent the circuit malfunction which otherwise would occur due to coupling capacitances caused between their adjacent wires.

According to another aspect of the semiconductor integrated circuit of the present invention, a memory core is composed of having alternately arranged memory cell arrays each having a plurality of memory cells and sense amplifier arrays each having a plurality of sense amplifiers. The first and second regions are alternately formed over the memory cell arrays, and the switching regions are formed over the sense amplifier arrays. The first data lines transfer write data to be inputted to the memory cell arrays at a write operation, and the second data lines transfer read data outputted from the memory cell arrays at a read operation. The write and read data are inputted to/outputted from the memory cell arrays via the sense amplifiers, respectively.

In general, the read data are amplified by the sense amplifiers and then outputted to the data lines during the read operation of the memory core. During the write operation of the memory core, the write data transferred to the data lines are amplified by the sense amplifiers and thereafter written into the memory cells. That is, the first and second data lines for transferring the write and read data respectively, are both connected to the sense amplifiers. For example, the first and second data lines are connected to the sense amplifiers via different wiring layers and throughholes over the sense amplifier arrays. Since the first and second data lines are formed over the sense amplifier arrays by use of a plurality of wiring layers, the formation of the switching regions over the sense amplifier arrays can facilitate the connection of the first and second data lines of the first region to the first and second data lines of the second region.

The sense amplifier arrays have a lower density arrangement of elements such as transistors than the memory cell arrays. The formation of the switching regions over the sense amplifier arrays having such a lower element arrangement density also can facilitate the connection of the first and second data lines to the memory cell arrays.

According to another aspect of the semiconductor integrated circuit of the present invention, the first data lines are fixed at a first voltage during the read operation, and the second data lines are fixed at the first voltage or a voltage different from the first voltage during the write operation. That is, the first data lines serve as shield wires during the read operation, while the second data lines serve as shield wires during the write operation. When either the first data lines or the second data lines transfer data, the other data lines serve as the shield wires. This can prevent the coupling noise from their adjacent wires and hence prevent the circuit malfunction.

According to another aspect of the semiconductor integrated circuit of the present invention, in each of data line regions, the first and second regions are alternately arranged in the alignment direction of the memory cell arrays. In other words, one data line region composed of first and second data lines is formed adjacent to another data line region composed of another first and second data lines. In adjacent data line regions over a single memory cell array, the first and second regions are adjacent to each other. That is, the positioning of the first and second regions is vertically reversed between two adjacent data line regions. Two pieces each of write and read data to be transferred to the two data line regions may be complementary or may be of single phase. Having the wiring structure as described above prevents the concurrent operations of not only vertically adjacent data lines but also horizontally adjacent data lines. This can further prevent the coupling noise which otherwise would occur from vertically and horizontally adjacent wires.

According to another aspect of the semiconductor integrated circuit of the present invention, the memory cells are connected to the sense amplifiers via any bit line of complementary bit line pairs. Two data line regions where the complementary write data and the complementary read data are transferred are formed corresponding to the bit line pair. That is, each of the two data line regions is formed corresponding to the respective bit lines of each of a plurality of bit line pairs. For this reason, all the data read from the memory cells and then amplified by the sense amplifiers can be outputted to the exterior of the memory via the data line regions at the same time. Also, all the write data inputted from the exterior through the data line regions and then amplified by the sense amplifiers can be written into the memory cells at the same time. This can improve the transfer rates of the read and write data.

BRIEF DESCRIPTION OF DRAWINGS

The nature, principle, and utility of the invention will become more apparent from the following detailed description when read in conjunction with the accompanying drawings in which like parts are designated by identical reference numbers, in which.

DETAILED DESCRIPTION OF THE PREFERRED EMBODIMENTS

Embodiments of the present invention will be described below with reference to the drawings.

Figure 1:
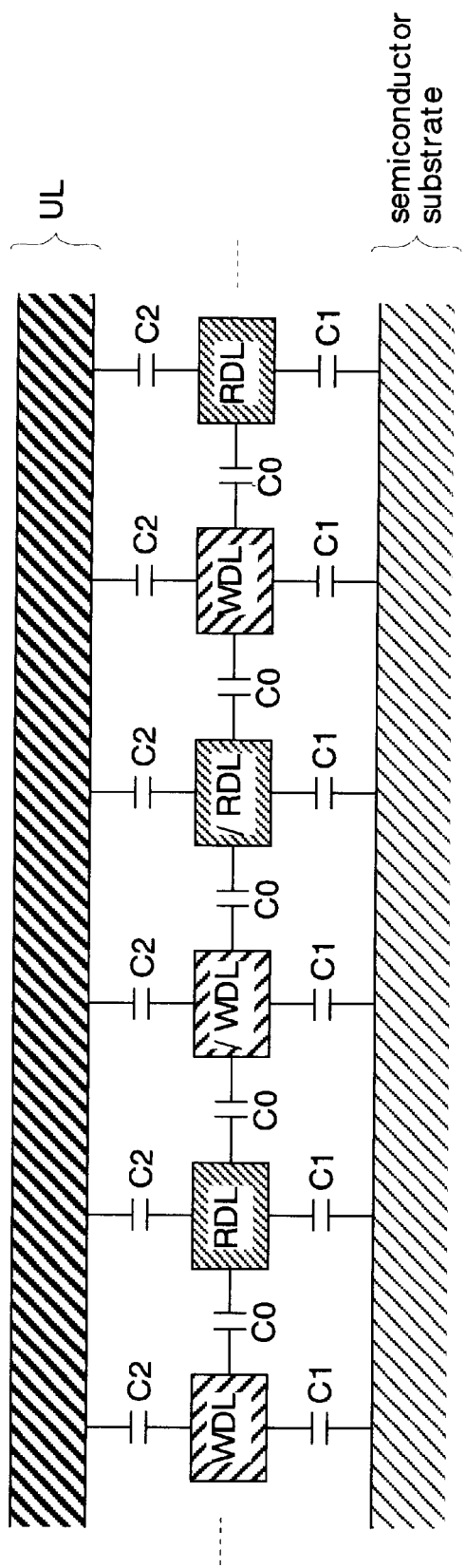
FIG. 1 is a diagram showing a cross-sectional view of a conventional wiring structure of data lines.
Figure 2:
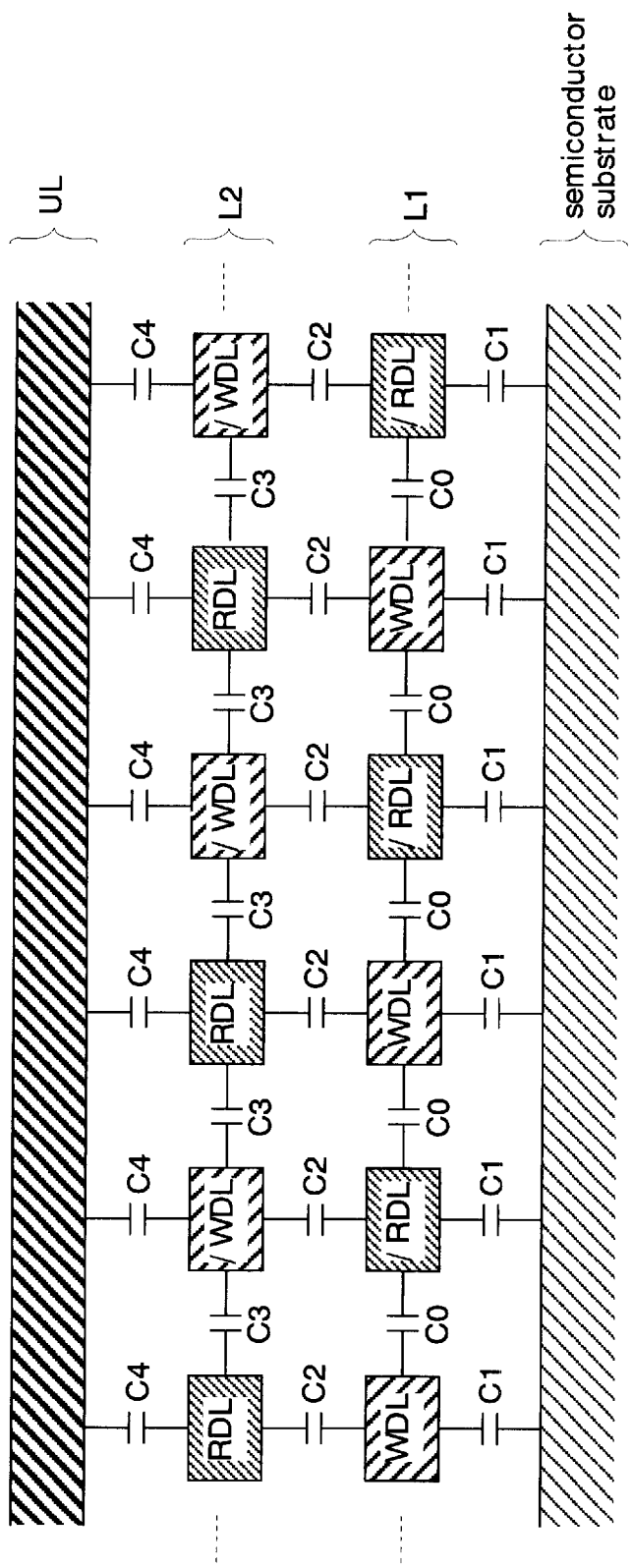
FIG. 2 is a diagram showing a cross-sectional view of a conventional wiring structure of data lines using two wiring layers.
Figure 3:
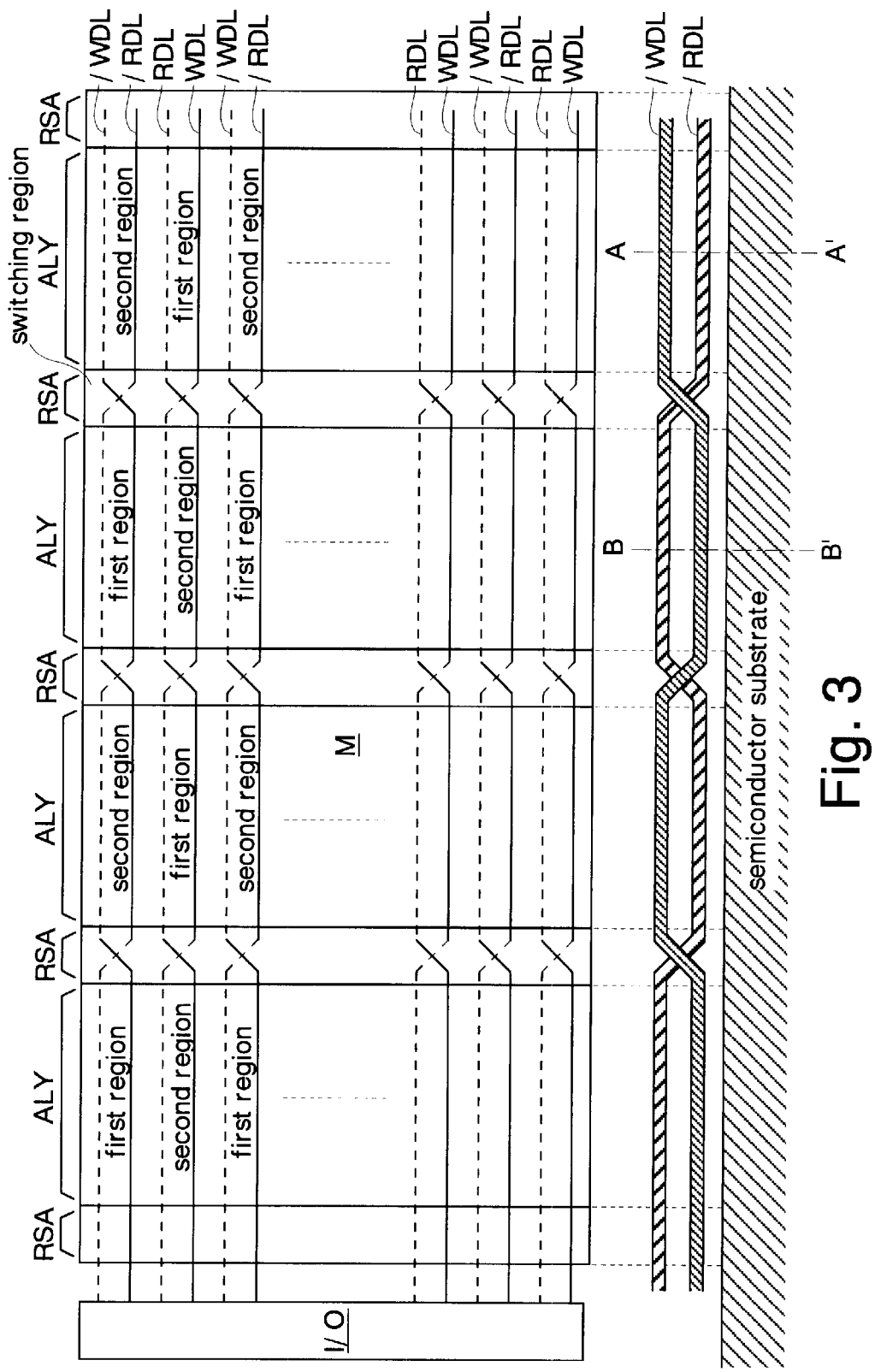
FIG. 3 is a block diagram showing an embodiment of the present invention.

FIG. 3 shows an embodiment of semiconductor integrated circuit according to the present invention. In this embodiment, elements corresponding to the same elements described in the foregoing prior art are identified by the same reference designations, and their detailed explanations are omitted. The semiconductor integrated circuit is formed as a DRAM on a silicon substrate.

The DRAM has a memory core M and an input/output circuit unit I/O. The memory core M has a plurality of memory cell arrays ALY and a plurality of sense amplifier arrays RSA, and these arrays ALY and RSA are alternately arranged. Between the memory core M and the input/output circuit unit I/O, complementary write data lines WDL and /WDL (first data lines) and complementary read data lines RDL and /RDL (second data lines) are wired by use of metal wiring layers over the semiconductor substrate. FIG. 3 uses dotted and solid lines that designate the upper and lower wiring layers, respectively. In the present embodiment, the data lines /WDL and /RDL are wired at the same position of the semiconductor substrate, and the data lines WDL and RDL are also wired at the same position of the semiconductor substrate.

The wiring layers forming data lines /WDL and /RDL as well as RDL and WDL are exchanged at switching regions formed over the sense amplifier arrays RSA. For example, as shown at the bottom of FIG. 3, the data lines /WDL and /RDL over the rightmost memory cell array ALY of FIG. 3 are wired by use of the upper and lower wiring layers, respectively, while the data lines /WDL and /RDL are wired over the adjacent memory cell array ALY by use of the lower and upper wiring layers, respectively.

Here, first and second regions are formed over the memory cell arrays ALY: in the first region the write and read data lines WDL and RDL (or /WDL and /RDL) are wired by use of the lower and upper wiring layers, respectively; and in the second region the write and read data lines WDL and RDL (or /WDL and /RDL) are wired by use of the upper and lower wiring layers, respectively. The details of the first and second regions will be described later with reference to FIG. 6.

Figure 4:
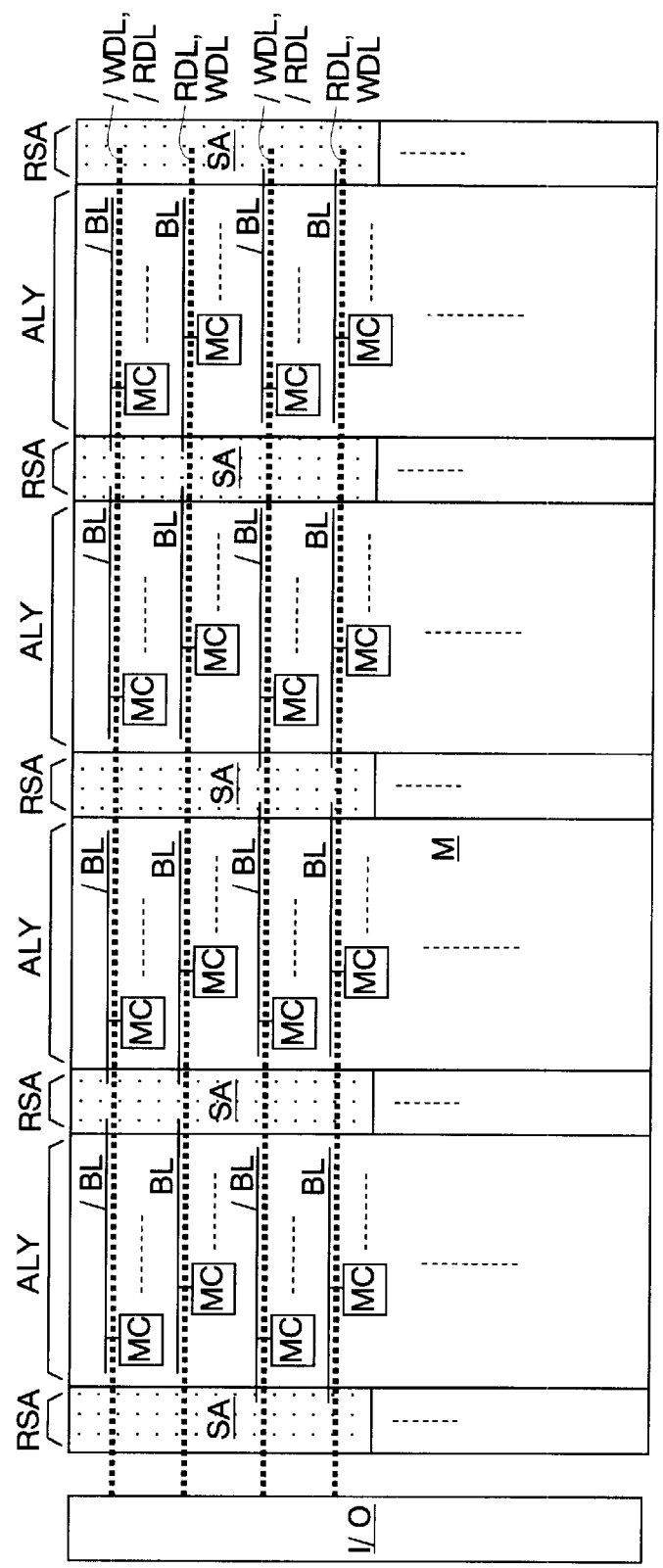
FIG. 4 is a block diagram showing the details of a memory core of FIG. 3.

FIG. 4 shows the details of the memory core M. The memory cell arrays ALY each have a plurality of memory cells MC arranged in matrix. The memory cells MC are connected to any of complementary bit lines BL and /BL wired in the lateral direction of FIG. 4. The sense amplifier arrays RSA each has a plurality of sense amplifiers SA arranged in the vertical direction of FIG. 4. FIG. 4 uses thick dotted lines along the bit lines BL and /BL to designate the data lines (/WDL, /RDL, WDL and RDL) wired above the bit lines BL and /BL.

Data read from the memory cells MC onto the bit lines BL and /BL and then amplified by the sense amplifiers SA are outputted to the input/output circuit unit I/O via the read data lines RDL and /RDL situated directly above the bit lines BL and /BL, respectively. Data supplied from the input/output circuit unit I/O via the write data lines WDL and /WDL are amplified by the sense amplifiers SA and then written into the memory cells MC via the bit lines BL and /BL situated directly beneath the write data lines WDL and /WDL, respectively. That is, in the present embodiment, dedicated data lines WDL and /WDL as well as RDL and /RDL are formed corresponding to the bit line pairs of BL and /BL, respectively.

In general, the memory core M employs a layout technique called "shared sense amplifier system," in which when one memory cell array ALY is activated, the sense amplifier arrays RSA on both sides of the activated memory cell array ALY are simultaneously activated, performing their amplifying operations. For this reason, the bit line pairs of BL and /BL are connected to the respective sense amplifiers SA on the left or right side of FIG. 4. In other words, the sense amplifier arrays RSA are shared between the memory cell arrays ALY on their respective both sides.

Figure 5:
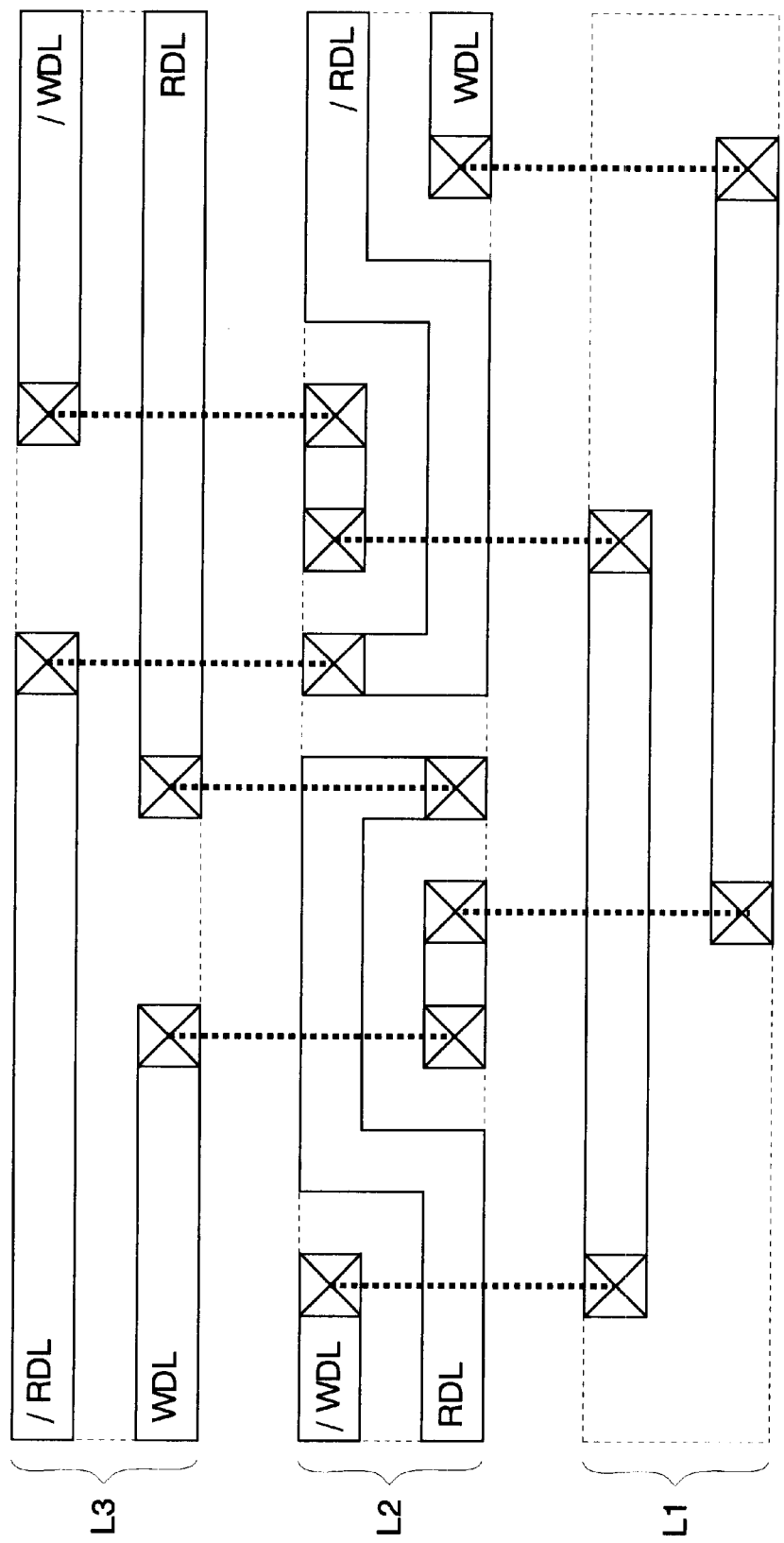
FIG. 5 is a diagram showing the details of a switching region of FIG. 3.

FIG. 5 shows the details of the switching region formed over a sense amplifier array RSA and associated with a pair of bit lines BL and /BL The upper and lower wiring layers as shown in FIG. 3 are formed as a third metal wiring layer L3 (a second wiring layer) and a second metal wiring layer L2 (a first wiring layer), respectively. FIG. 5 uses a symbol "X" to mean "contact" and uses thick dotted lines to designate through-holes. That is, the combinations of the symbols "X" and thick dotted lines show the connections of the data lines between different wire layers.

Parts of the data lines (in this example, the data lines WDL or /WDL) extending from the first and second regions are connected to each other via a first metal wiring layer L1 (a third wiring layer) formed on the semiconductor substrate side of the second metal wiring layer L2. Parts of the wiring patterns of the data lines RDL and /RDL wired in the second metal wiring layer L2 are generally U-shaped so as to avoid the connecting-portions of the first and second metal wiring layers L1 and. L2, and of the second and third metal wiring layers L2 and L3 for wiring the data lines WDL and /WDL.

Figure 6:
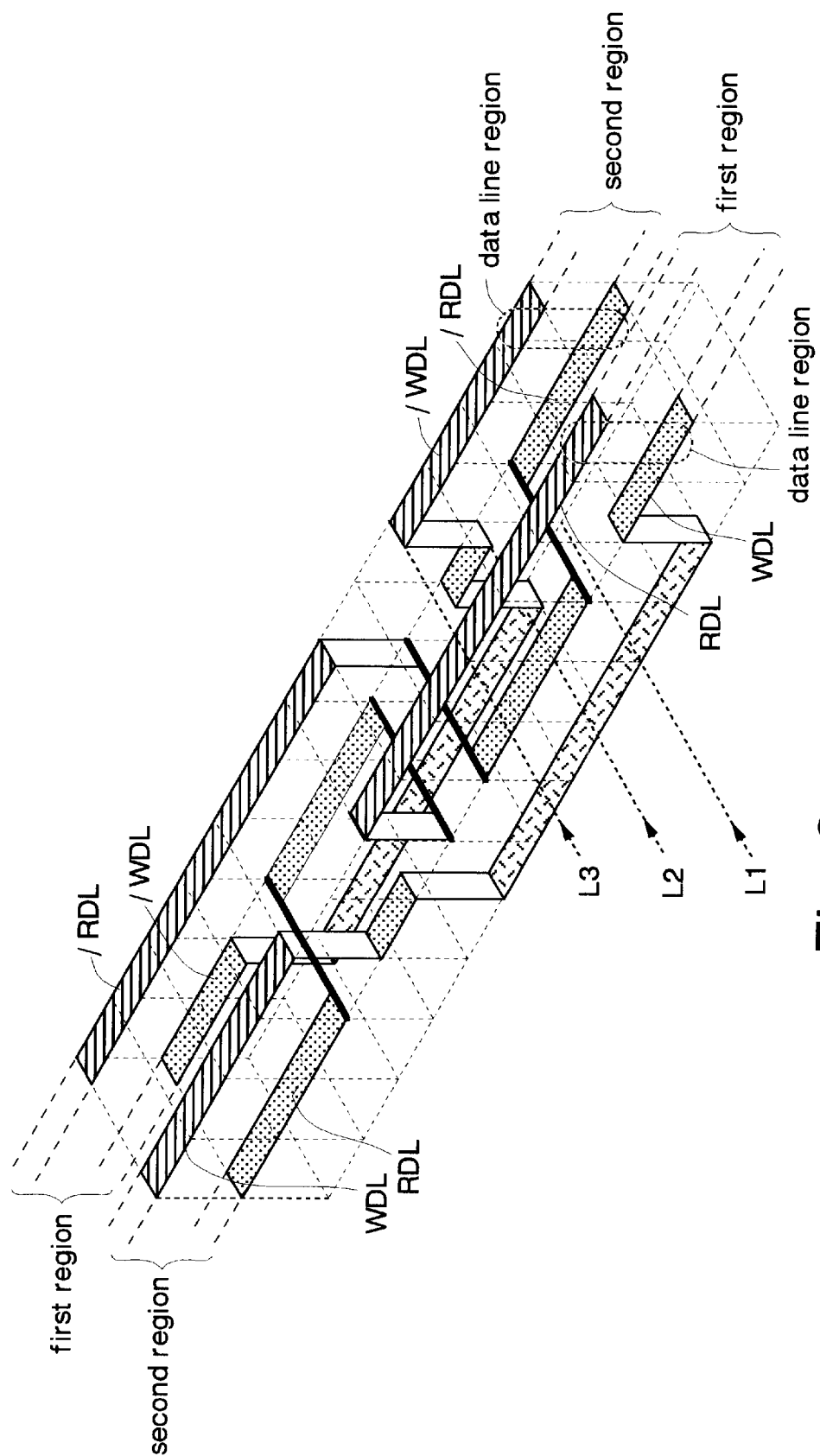
FIG. 6 is a diagram showing a perspective view of the details of the switching region of FIG. 3.

FIG. 6 shows in three dimensions the switching region associated with a pair of bit lines BL and /BL formed over a sense amplifier array RSA. For better understanding, FIG. 6 uses thick solid lines to designate wires orthogonal to the wiring direction of the data lines.

In a data line region where the data lines /WDL and /RDL situated on the back side of FIG. 6 are wired, the left-upper and right-lower ends correspond to the first and second regions, respectively. In a data line region where the data lines WDL and RDL situated on the front side of FIG. 6 are wired, the left-upper and right-lower ends correspond to the second and first regions, respectively. That is, the two data line regions where the first and second regions are reversed are formed respectively corresponding to a bit line pair of BL and /BL (not shown).

Figure 7:
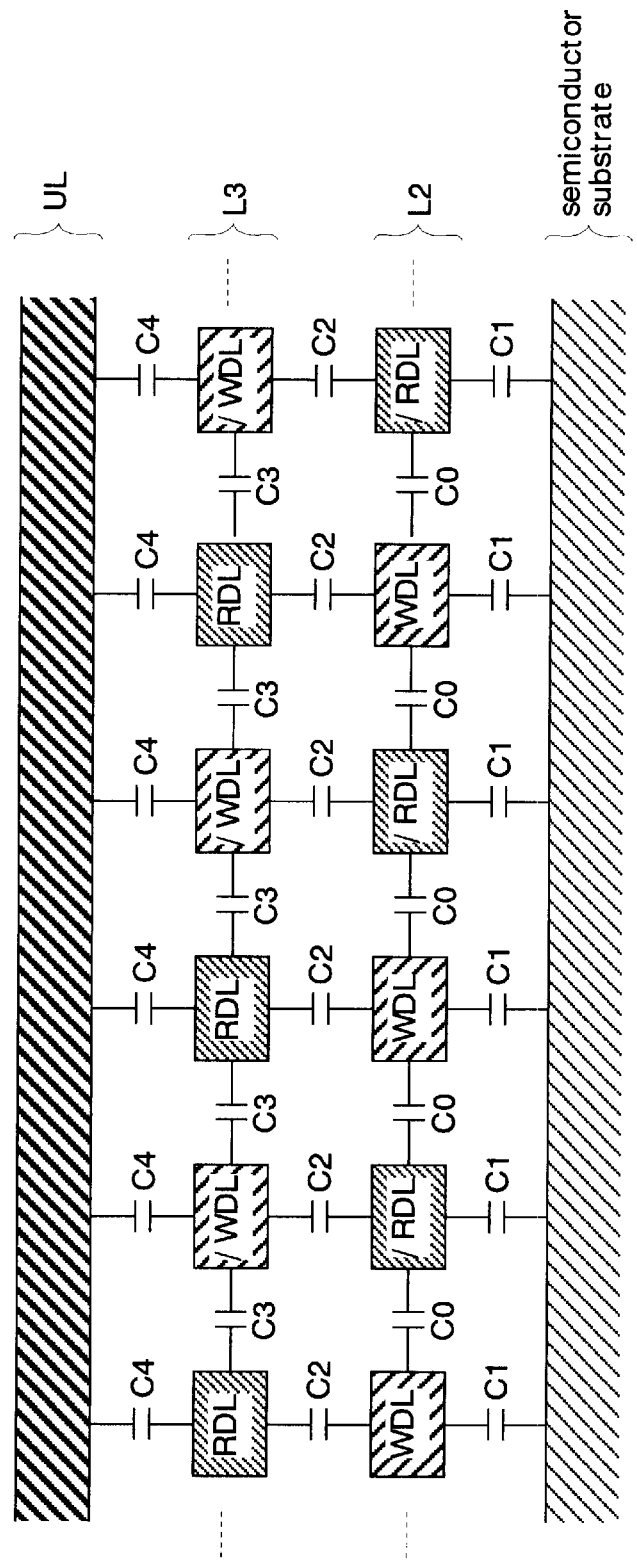
FIG. 7 is a diagram showing a cross-sectional view taken along a line A–A' of FIG. 3.

FIG. 7 shows a cross-sectional view taken along the line A–A' shown in FIG. 3. In the second metal wiring layer L2, there exist parasitic capacitances C0 between the adjacent data lines, while there exist parasitic capacitances C1 between the data lines and the semiconductor substrate. In the third metal wiring layer L3, there exist parasitic capacitances C3 between the adjacent data lines, while there exist parasitic capacitances C4 between the data lines and the metal wire UL of the overlying layer. Moreover, there exist parasitic capacitances C2 between the data lines of the second metal wiring layer L2 and the data lines of the third metal wiring layer L3.

Figure 8:
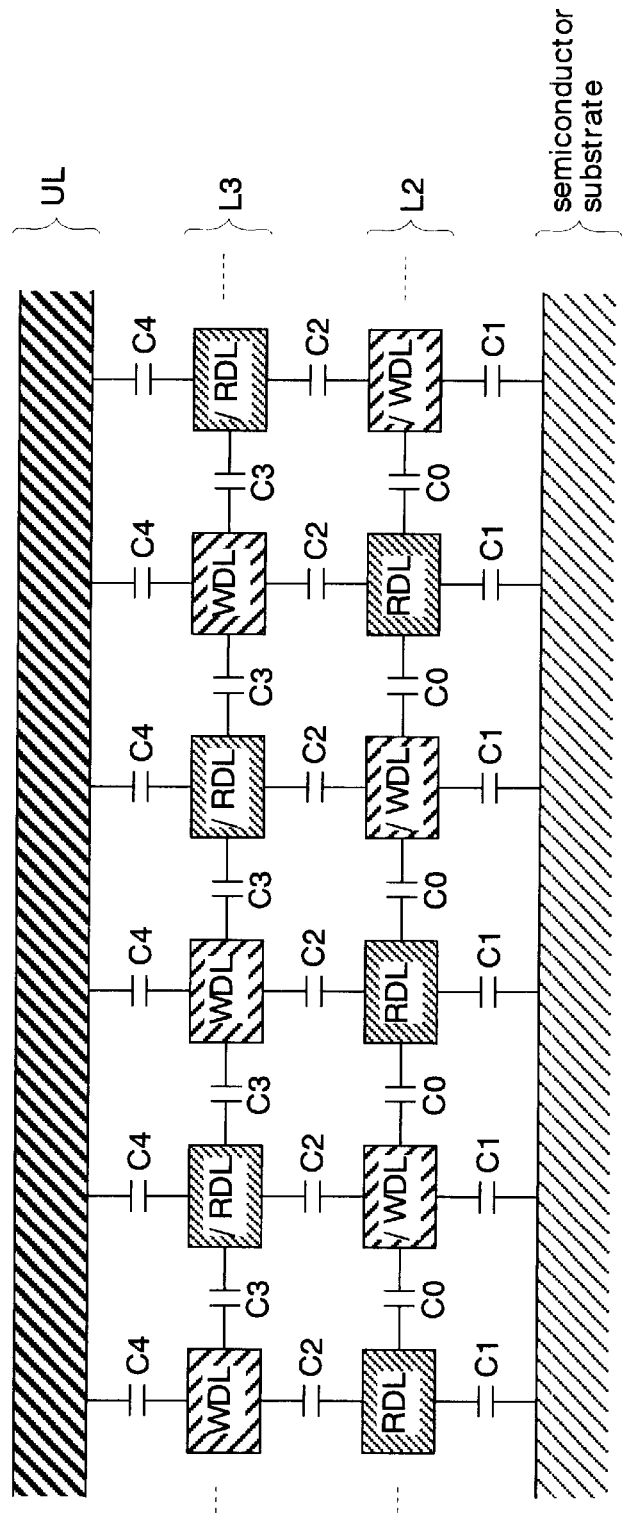
FIG. 8 is a diagram showing a cross-sectional view taken along a line B–B' of FIG. 3.

FIG. 8 shows a cross-sectional view taken along the line B–B' shown in FIG. 3. FIG. 8 is identical with FIG. 7 except that the data lines are reversed between the second and third metal wiring layers L2 and L3.

As can be seen from FIGS. 7 and 8, the data lines are wired by using the second and third metal wiring layers L2 and L3 alternately. Thus, the data lines WDL, /WDL, RDL and /RDL each alternately have a parasitic capacitance of "2C0+C1+C2" in the second metal wiring layer L2 and a parasitic capacitance of "2C3+C2+C4" in the third metal wiring layer L3. As a result, the total parasitic capacitances associated with the data lines WDL, /WDL, RDL and /RDL all are of the same value, which is "(2C0+C1+C2)/2+(2C3+C2+C4)/2". Here, the parasitic capacitances in the wiring regions of the first metal wiring layer L1 used in the switching regions shown in FIG. 3 are very small and negligible, as compared to the total parasitic capacitances of the data lines WDL, /WDL, RDL and /RDL, and hence are not included in the above calculation. That is, according to the present invention, the transfer times (delay times) required for transferring the data along the data lines are equal to one another even in a case when the data lines are wired by use of a plurality of wiring layers.

Next, the read and write operations of the DRAM of the present embodiment will be briefly described below.

During a read operation, in the memory core M shown in FIG. 4, a memory cell array ALY is activated in accordance with an address supplied from the exterior, and the sense amplifier arrays RSA on both sides of the activated memory cell array ALY are also activated. All the read data amplified by the sense amplifiers SA (complementary data on the bit lines BL and /BL) are transferred to the input/output circuit unit I/O via the read data lines RDL and /RDL At this moment, the write data lines WDL and /WDL serve as shield wires, being fixed at a first voltage (e.g., a ground voltage), and hence the coupling noise from adjacent data lines can be prevented.

As previously described, the delay times taken for transferring the complementary read data along the data lines RDL and /RDL are equal to each other. Therefore, the input/output circuit unit I/O can receive the complementary read data at the same timing. This prevents the malfunction of the input/output circuit unit I/O which otherwise would be caused by erroneous read data received by the input/output circuit unit I/O. Then, the input/output circuit unit I/O outputs the read data to the exterior at the same time; or instead, the input/output circuit unit I/O sequentially outputs the read data in synchronization with clocks or the like.

During a write operation, the input/output circuit unit I/O receives a plurality of bits of write data supplied from the exterior and transfers the received write data to the sense amplifier arrays RSA via the write data lines WDL and /WDL at the same time. As previously described, the delay times required for transferring the complementary write data along the data lines WDL and /WDL are equal to each other. For this reason, the sense amplifiers SA of the sense amplifier arrays RSA can receive the complementary write data at the same timing. This prevents the sense amplifiers SA from amplifying erroneous write data to cause a malfunction. After amplified by the sense amplifiers SA, the write data are written into the memory cells MC via the bit lines BL and /BL. At this moment, the read data lines RDL and /RDL serve as shield wires, being fixed at the first voltage (e.g., a ground voltage), and hence the coupling noise from their adjacent data lines can be prevented.

As set forth above, in the present embodiment, the wiring layers of the data lines WDL and RDL as well as /WDL and /RDL not simultaneously operating are exchanged at the switching regions to wire the data lines WDL and RDL as well as /WDL and /RDL over the memory core M. For this reason, the data lines WDL and RDL as well as WDL and /RDL have practically equal total parasitic capacitances. As a result, the signals transferred along the data lines WDL and RDL as well as the signals transferred along the data lines /WDL and /RDL have the same delay time, which prevents the circuit malfunction which otherwise would occur due to a parasitic capacitance difference.

In addition, it is possible to shorten the distances at which the data lines WDL and RDL as well as /WDL and /RDL extend in parallel to the overlying metal wire UL or the underlying wire, which prevents the circuit malfunction occurring due to a coupling capacitance between their adjacent wires.

Since the switching regions are formed over the sense amplifier arrays RSA that connect the data lines WDL, /WDL, RDL and /RDL to the sense amplifiers SA, it is easy to connect these data lines WDL, /WDL, RDL and /RDL to the memory cell arrays ALY. Moreover, forming the switching regions over the sense amplifier arrays RSA that have a lower density of wiring elements such as transistors than the memory cell arrays ALY can facilitate the connection of these data lines WDL /WDL, RDL and /RDL to the memory cell arrays ALY.

During the read operation, the write data lines WDL and /WDL serve as shield wires, and during the write operation, the read data lines RDL and /RDL serve as shield wires. This can prevent the coupling noise from occurring from their adjacent wires, which can further prevent the circuit malfunction.

The write data lines WDL and /WDL and the read data lines RDL and /RDL were alternately wired not only in the vertical direction but also in the horizontal direction. This can prevent the data lines from being affected by the coupling noise from their vertically and horizontally adjacent wires.

Two data line regions having four data lines for transferring complementary write and read data were formed respectively corresponding to a bit line pair of BL and /BL. For this reason, all the read data read from the memory cells MC and then amplified by the sense amplifiers SA can be transferred to the data lines and outputted to the exterior at the same time. Additionally, all the write data inputted from the exterior through the data line regions and then amplified by the sense amplifiers SA can be written into the memory cells MC at the same time. As a result, the read and write data transfer rates can be improved.

The foregoing embodiment was described as an example where the present invention was applied to a DRAM. The present invention is not limited to such an embodiment. For example, the present invention may be applied to a microcomputer, a logic LSI, or a system LSI that implements a DRAM core.

The foregoing embodiment was described as an example where the present invention was applied to the wiring structure of the complementary data lines WDL, /WDL, RDL and /RDL The present invention is not limited to such an embodiment. For example, the present invention may be applied to the wiring structure of single-phase data lines WDL and RDL.

The invention is not limited to the above embodiments and various modifications may be made without departing from the spirit and the scope of the invention. Any improvement may be made in part or all of the components.

What is claimed is:

1. A semiconductor integrated circuit having first and second data lines for transferring data at respective different timings, said semiconductor integrated circuit comprising:

first region(s) in which said first data line is formed in a first wiring layer above a semiconductor substrate and said second data line extending over said first data line is formed in a second wiring layer above said first wiring layer;

second region(s) in which said second data line is formed in said first wiring layer and said first data line extending over said second data line is formed in said second wiring layer; and switching region(s) formed between said first and second regions for connecting the first data line in said first region with the first data line in said second region, and for connecting the second data line in said first region with the second data line in said second region, wherein in said switching region at least either of said first data lines and said second data lines are connected with each other via a third wiring layer formed above said semiconductor substrate.

2. The semiconductor integrated circuit according to claim 1, further comprising a memory core in which memory cell arrays each having a plurality of memory cells and sense amplifier arrays each having a plurality of sense amplifiers are alternately arranged, and wherein:

said first and second regions are alternately formed above said memory cell arrays;

said switching regions are formed above said sense amplifier arrays;

said first data lines transfer write data to be inputted to said memory cell arrays at a write operation;

said second data lines transfer read data outputted from said memory cell arrays at a read operation; and said write and read data are inputted to/outputted from said memory cell arrays via said sense amplifiers, respectively.

3. The semiconductor integrated circuit according to claim 2, wherein:

said first data lines are fixed at a first voltage during said read operation; and said second data lines are fixed at said first voltage during said write operation.

4. The semiconductor integrated circuit according to claim 2, further comprising a plurality of data line regions in which said first and second regions are alternately arranged in the alignment direction of said memory cell arrays, wherein said first and second regions are adjacent to each other between the data line regions which are adjacent to each other above each of said memory cell arrays.

5. The semiconductor integrated circuit according to claim 4, wherein two pieces of said write data and two pieces of read data are complementary, respectively, said write data and said read data being transferred to two said data line regions which are adjacent to each other.

6. The semiconductor integrated circuit according to claim 5, further comprising a plurality of bit line pairs each consisting of complementary bit lines for connecting said memory cells with said sense amplifiers, and wherein each of said two adjacent data line regions is formed corresponding to the respective bit lines of each of said bit line pairs.

* * * * *